(12) United States Patent
Shia et al.

(10) Patent No.: US 7,965,124 B1
(45) Date of Patent: Jun. 21, 2011

(54) SWITCHED-CAPACITOR CIRCUIT RELATING TO SUMMING AND INTEGRATION ALGORITHMS

(75) Inventors: Tim Kuei Shia, Taichung County (TW); Jia-Chun Huang, Miaoli County (TW); Chien-Hua Cheng, Changhua County (TW); Bo-Wei Chen, Miaoli County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 12/813,518

(22) Filed: Jun. 11, 2010

(30) Foreign Application Priority Data

Apr. 15, 2010 (TW) ................................ 99111789 A (51) Int. Cl.
*H03K 5/00* (2006.01)
(52) U.S. Cl. ........................................ 327/337; 327/554
(58) Field of Classification Search .......... 327/552–559, 327/336–337, 94–96, 361
See application file for complete search history.

(56) References Cited

U.S. PATENT DOCUMENTS

| 5,391,999 A | * | 2/1995 | Early et al. ..................... 327/337 |
| 5,495,200 A | * | 2/1996 | Kwan et al. .................... 327/553 |
| 6,727,749 B1 | | 4/2004 | Quinn | |

* cited by examiner

*Primary Examiner* — Dinh T. Le
(74) *Attorney, Agent, or Firm* — Jianq Chyun IP Office (57) ABSTRACT

A switched-capacitor (SC) circuit relating to summing and integration algorithms is provided. The SC circuit submitted by the present invention benefits from better closed-loop bandwidth performance because of combining positive and negative feedback loops of a high gain amplifier. In addition, the SC circuit submitted by the present invention not only provides differential output signal obtained by a summing (or integration) algorithm of input voltage signals and reference voltage signals and forward drives such differential output signal to a next stage SC circuit, but also provides flexible and accurate coefficient design for every individual input and reference voltage signals in the said algorithm. Besides, if the circuit manner of alternate resetting is disabled or removed, the SC summing circuit submitted by the present invention can serve as an SC integration circuit.

16 Claims, 3 Drawing Sheets

SWITCHED-CAPACITOR CIRCUIT RELATING TO SUMMING AND INTEGRATION ALGORITHMS

CROSS-REFERENCE TO RELATED APPLICATION

This application claims the priority benefit of Taiwan application serial no. 99111789, filed on Apr. 15, 2010. The entirety of the above-mentioned patent application is hereby incorporated by reference herein and made a part of specification.

BACKGROUND OF THE INVENTION

1. Technical Field

The present disclosure relates to a switched-capacitor circuit, more particularly, to a switched-capacitor circuit relating to summing and integration algorithms.

2. Background

A switched-capacitor (SC) circuit plays an important role in a deep sub-micron complementary metal oxide semiconductor (CMOS) integrated circuit since a design of the SC circuit generally uses integrated capacitance ratio and sampling frequency to implement a transfer function in quantitative charges. Therefore, a time constant formed by tunable equivalent resistor-capacitor network can be provided. Moreover, since such circuit design can greatly mitigate fabrication variation of integrated resistor and capacitor, it is commonly used in a baseband circuit design.

SUMMARY

The disclosure provides a switched-capacitor (SC) circuit including a fully differential amplifier, a first and a second adjustable feedback capacitors, a first to a fourth switches, a first and second twin sampling capacitors, a first switching unit and an output switching unit. The fully differential amplifier has a positive input terminal, a negative input terminal, a positive output terminal and a negative output terminal. A first end of the first adjustable feedback capacitor is coupled to the negative input terminal of the fully differential amplifier, and a second end of the first adjustable feedback capacitor is coupled to the positive output terminal of the fully differential amplifier.

A first end of the first switch is used for receiving a common mode potential, and a clock-control end of the first switch is used for receiving a first clock control signal. A first end of the second switch is coupled to the negative input terminal of the fully differential amplifier, a second end of the second switch is coupled to a second end of the first switch, and a clock-control end of the second switch is used for receiving a second clock control signal. A first end of the first twin sampling capacitor is coupled to the second end of the second switch, and a second end and a third end of the first twin sampling capacitor are used for receiving a first positive input voltage relative to the common mode potential in response to a third clock control signal.

A first end of the second adjustable feedback capacitor is coupled to the positive input terminal of the fully differential amplifier, and a second end of the second adjustable feedback capacitor is coupled to the negative output terminal of the fully differential amplifier. A first end of the third switch is used for receiving the common mode potential, and a clock-control end of the third switch is used for receiving the first clock control signal. A first end of the fourth switch is coupled to the positive input terminal of the fully differential amplifier, a second end of the fourth switch is coupled to a second end of the third switch, and a clock-control end of the fourth switch is used for receiving the second clock control signal. A first end of the second twin sampling capacitor is coupled to the second end of the fourth switch, and a second end and a third end of the second twin sampling capacitor are used for receiving a first negative input voltage relative to the common mode potential in response to the third clock control signal.

The first switching unit is coupled to the second ends and the third ends of the first and the second twin sampling capacitors and the positive output terminal and the negative output terminal of the fully differential amplifier, and is used for determining coupling relations respectively between the second ends and the third ends of the first and the second twin sampling capacitors and the positive output terminal and the negative output terminal of the fully differential amplifier in response to a fourth clock control signal. The output switching unit is coupled to the positive output terminal and the negative output terminal of the fully differential amplifier, and is used for outputting (transferring) a differential output signal in response to the third clock control signal.

In an exemplary embodiment of the disclosure, the switched-capacitor circuit further includes a third and a fourth adjustable feedback capacitors and a twenty-third to a thirty-eighth switches. Wherein, a first end of the twenty-third switch is coupled to the negative input terminal of the fully differential amplifier, a second end of the twenty-third switch is coupled to the first end of the first adjustable feedback capacitor, and a clock-control end of the twenty-third switch is used for receiving a fifth clock control signal. A first end of the twenty-fourth switch is coupled to the second end of the first adjustable feedback capacitor, a second end of the twenty-fourth switch is coupled to the positive output terminal of the fully differential amplifier, and a clock-control end of the twenty-fourth switch is used for receiving a sixth clock control signal.

A first end of the twenty-fifth switch is coupled to the negative input terminal of the fully differential amplifier, and a clock-control end of the twenty-fifth switch is used for receiving a seventh clock control signal. A first end of the third adjustable feedback capacitor is coupled to a second end of the twenty-fifth switch. A first end of the twenty-sixth switch is coupled to a second end of the third adjustable feedback capacitor, a second end of the twenty-sixth switch is coupled to the positive output terminal of the fully differential amplifier, and a clock-control end of the twenty-sixth switch is used for receiving an eighth clock control signal. A first end of the twenty-seventh switch is coupled to the second end of the twenty-fifth switch, a second end of the twenty-seventh switch is used for receiving the common mode potential, and a clock-control end of the twenty-seventh switch is used for receiving the fifth clock control signal.

A first end of the twenty-eighth switch is coupled to the first end of the first adjustable feedback capacitor, a second end of the twenty-eighth switch is used for receiving the common mode potential, and a clock-control end of the twenty-eighth switch is used for receiving the seventh clock control signal. A first end of the twenty-ninth switch is coupled to the second end of the third adjustable feedback capacitor, a second end of the twenty-ninth switch is used for receiving the common mode potential, and a clock-control end of the twenty-ninth switch is used for receiving the fifth clock control signal. A first end of the thirtieth switch is coupled to the second end of the first adjustable feedback capacitor, a second end of the thirtieth switch is used for receiving the common mode potential, and a clock-control end of the thirtieth switch is used for receiving the seventh clock control signal.

A first end of the thirty-first switch is coupled to the positive input terminal of the fully differential amplifier, a second end of the thirty-first switch is coupled to the first end of the second adjustable feedback capacitor, and a clock-control end of the thirty-first switch is used for receiving the fifth clock control signal. A first end of the thirty-second switch is coupled to the second end of the second adjustable feedback capacitor, a second end of the thirty-second switch is coupled to the negative output terminal of the fully differential amplifier, and a clock-control end of the thirty-second switch is used for receiving the sixth clock control signal.

A first end of the thirty-third switch is coupled to the positive input terminal of the fully differential amplifier, and a clock-control end of the thirty-third switch is used for receiving the seventh clock control signal. A first end of the fourth adjustable feedback capacitor is coupled to a second end of the thirty-third switch. A first end of the thirty-fourth switch is coupled to a second end of the fourth adjustable feedback capacitor, a second end of the thirty-fourth switch is coupled to the negative output terminal of the fully differential amplifier, and a clock-control end of the thirty-fourth switch is used for receiving the eighth clock control signal. A first end of the thirty-fifth switch is coupled to the second end of the thirty-third switch, a second end of the thirty-fifth switch is used for receiving the common mode potential, and a clock-control end of the thirty-fifth switch is used for receiving the fifth clock control signal.

A first end of the thirty-sixth switch is coupled to the first end of the third adjustable feedback capacitor, a second end of the thirty-sixth switch is used for receiving the common mode potential, and a clock-control end of the thirty-sixth switch is used for receiving the seventh clock control signal. A first end of the thirty-seventh switch is coupled to the second end of the fourth adjustable feedback capacitor, a second end of the thirty-seventh switch is used for receiving the common mode potential, and a clock-control end of the thirty-seventh switch is used for receiving the fifth clock control signal. A first end of the thirty-eighth switch is coupled to the second end of the third adjustable feedback capacitor, a second end of the thirty-eighth switch is used for receiving the common mode potential, and a clock-control end of the thirty-eighth switch is used for receiving the seventh clock control signal.

In order to make the aforementioned and other features and advantages of the present disclosure comprehensible, several exemplary embodiments accompanied with figures are described in detail below.

BRIEF DESCRIPTION OF THE DRAWINGS

The accompanying drawings are included to provide further understanding of the disclosure, and are incorporated in and constitute a part of this specification. The drawings illustrate embodiments of the disclosure and, together with the description, serve to explain the principles of the disclosure.

DETAILED DESCRIPTION OF DISCLOSED EMBODIMENTS

Reference will now be made in detail to the present preferred embodiments of the disclosure, examples of which are illustrated in the accompanying drawings. Wherever possible, the same reference numbers are used in the drawings and the description to indicate the same or like parts.

Figure 1:
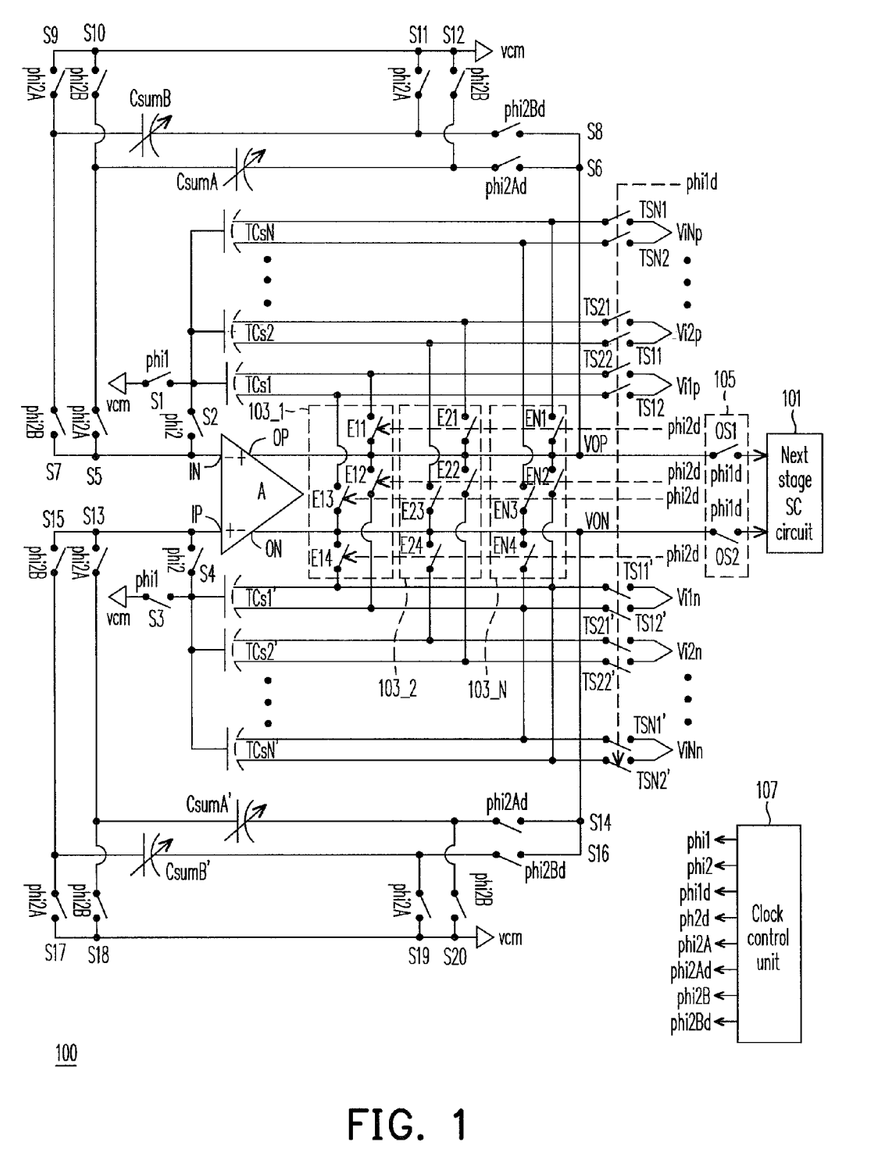
FIG. 1 is a schematic diagram illustrating a switched-capacitor summing circuit according to an exemplary embodiment of the disclosure.

FIG. 1 is a schematic diagram illustrating a switched-capacitor summing circuit 100 according to an exemplary embodiment of the disclosure. Referring to FIG. 1, the switched-capacitor summing circuit 100 includes a fully differential amplifier A (which is, for example, a fully differential high gain amplifier), adjustable feedback capacitors CsumA, CsumA', CsumB and CsumB', switches S1-S20, TSx1 (x=1, 2, ..., N) and TSx2 (x=1, 2, ..., N), twin sampling capacitors TCsx (x=1, 2, ..., N) and TCsx' (x=1, 2, ..., N), switching units 103_x (x=1, 2, ..., N), an output switching unit 105, and a clock control unit 107.

In the present exemplary embodiment, the fully differential amplifier A has a positive input terminal IP, a negative input terminal IN, a positive output terminal OP and a negative output terminal ON. A first end of the adjustable feedback capacitor CsumA is coupled to the negative input terminal IN of the fully differential amplifier A through the switch S5, and a second end of the adjustable feedback capacitor CsumA is coupled to the positive output terminal OP of the fully differential amplifier A through the switch S6. Wherein, a first end of the switch S5 is coupled to the negative input terminal IN of the fully differential amplifier A, a second end of the switch S5 is coupled to the first end of the adjustable feedback capacitor CsumA, and a clock-control end of the switch S5 is used for receiving a clock control signal phi2A. Moreover, a first end of the switch S6 is coupled to the second end of the adjustable feedback capacitor CsumA, a second end of the switch S6 is coupled to the positive output terminal OP of the fully differential amplifier A, and a clock-control end of the switch S6 is used for receiving a clock control signal phi2Ad.

Similarly, a first end of the adjustable feedback capacitor CsumB is coupled to the negative input terminal IN of the fully differential amplifier A through the switch S7, and a second end of the adjustable feedback capacitor CsumB is coupled to the positive output terminal OP of the fully differential amplifier A through the switch S8. Wherein, a first end of the switch S7 is coupled to the negative input terminal IN of the fully differential amplifier A, a second end of the switch S7 is coupled to the first end of the adjustable feedback capacitor CsumB, and a clock-control end of the switch S7 is used for receiving a clock control signal phi2B. Moreover, a first end of the switch S8 is coupled to the second end of the adjustable feedback capacitor CsumB, a second end of the switch S8 is coupled to the positive output terminal OP of the fully differential amplifier A, and a clock-control end of the switch S8 is used for receiving a clock control signal phi2Bd.

Moreover, a first end of the switch S9 is coupled to the second end of the switch S7, a second end of the switch S9 is used for receiving a common mode potential vcm, and a clock-control end of the switch S9 is used for receiving the clock control signal phi2A. A first end of the switch S10 is coupled to the first end of the adjustable feedback capacitor CsumA, a second end of the switch S10 is used for receiving the common mode potential vcm, and a clock-control end of the switch S10 is used for receiving the clock control signal phi2B. A first end of the switch S11 is coupled to the second end of the adjustable feedback capacitor CsumB, a second end of the switch S11 is used for receiving the common mode potential vcm, and a clock-control end of the switch S11 is used for receiving the clock control signal phi2A. A first end of the switch S12 is coupled to the second end of the adjustable feedback capacitor CsumA, a second end of the switch S12 is used for receiving the common mode potential vcm, and a clock-control end of the switch S12 is used for receiving the clock control signal phi2B.

Correspondingly, a first end of the adjustable feedback capacitor CsumA' is coupled to the positive input terminal IP of the fully differential amplifier A through the switch S13, and a second end of the adjustable feedback capacitor CsumA' is coupled to the negative output terminal ON of the fully differential amplifier A through the switch S14. Wherein, a first end of the switch S13 is coupled to the positive input terminal IP of the fully differential amplifier A, a second end of the switch S13 is coupled to the first end of the adjustable feedback capacitor CsumA', and a clock-control end of the switch S13 is used for receiving the clock control signal phi2A. Moreover, a first end of the switch S14 is coupled to the second end of the adjustable feedback capacitor CsumA', a second end of the switch S14 is coupled to the negative output terminal ON of the fully differential amplifier A, and a clock-control end of the switch S14 is used for receiving the clock control signal phi2Ad.

Similarly, a first end of the adjustable feedback capacitor CsumB' is coupled to the positive input terminal IP of the fully differential amplifier A through the switch S15, and a second end of the adjustable feedback capacitor CsumB' is coupled to the negative output terminal ON of the fully differential amplifier A through the switch S16. Wherein, a first end of the switch S15 is coupled to the positive input terminal IP of the fully differential amplifier A, a second end of the switch S15 is coupled to the first end of the adjustable feedback capacitor CsumB', and a clock-control end of the switch S15 is used for receiving the clock control signal phi2B. Moreover, a first end of the switch S16 is coupled to the second end of the adjustable feedback capacitor CsumB', a second end of the switch S16 is coupled to the negative output terminal ON of the fully differential amplifier A, and a clock-control end of the switch S16 is used for receiving the clock control signal phi2Bd.

Moreover, a first end of the switch S17 is coupled to the second end of the switch S15, a second end of the switch S17 is used for receiving the common mode potential vcm, and a clock-control end of the switch S17 is used for receiving the clock control signal phi2A. A first end of the switch S18 is coupled to the first end of the adjustable feedback capacitor CsumA', a second end of the switch S18 is used for receiving the common mode potential vcm, and a clock-control end of the switch S18 is used for receiving the clock control signal phi2B. A first end of the switch S19 is coupled to the second end of the adjustable feedback capacitor CsumB', a second end of the switch S19 is used for receiving the common mode potential vcm, and a clock-control end of the switch S19 is used for receiving the clock control signal phi2A. A first end of the switch S20 is coupled to the second end of the adjustable feedback capacitor CsumA', a second end of the switch S20 is used for receiving the common mode potential vcm, and a clock-control end of the switch S20 is used for receiving the clock control signal phi2B.

In addition, a first end of the switch S1 is used for receiving the common mode potential vcm, and a clock-control end of the switch S1 is used for receiving the clock control signal phi1. A first end of the switch S2 is coupled to the negative input terminal IN of the fully differential amplifier A, a second end of the switch S2 is coupled to a second end of the switch S1, and a clock-control end of the switch S2 is used for receiving the clock control signal phi2. A first end of the twin sampling capacitor TCsx (x=1, 2, ..., N) is coupled to the second end of the switch S2, and a second end and a third end of the twin sampling capacitor TCsx (x=1, 2, ..., N) receive a positive input voltage Vixp (x=1, 2, ..., N) relative to the common mode potential vcm in response to the clock control signal phi1$d$. For example, the second end and the third end of the twin sampling capacitor TCs1 (i.e. x=1) receive the positive input voltage Vi1$p$ relative to the common mode potential vcm in response to the clock control signal phi1$d$. The others are deduced by analogy, and detailed descriptions thereof are not repeated.

In detail, the second end and the third end of the twin sampling capacitor TCsx (x=1, 2, ..., N) receive the positive input voltage Vixp (x=1, 2, ..., N) relative to the common mode potential vcm respectively through switches TSx1 (x=1, 2, ..., N) and TSx2 (x=1, 2, ..., N). Wherein, a first end of the switch TSx1 (x=1, 2, ..., N) is coupled to the second end of the twin sampling capacitor TCsx (x=1, 2, ..., N), a second end of the switch TSx1 (x=1, 2, ..., N) is used for receiving the positive input voltage Vixp (x=1, 2, ..., N) relative to the common mode potential vcm, and a clock-control end of the switch TSx1 (x=1, 2, ..., N) is used for receiving the clock control signal phi1$d$. Moreover, a first end of the switch TSx2 (x=1, 2, ..., N) is coupled to the third end of the twin sampling capacitor TCsx (x=1, 2, ..., N), a second end of the switch TSx2 (x=1, 2, ..., N) is used for receiving the positive input voltage Vixp (x=1, 2, ..., N) relative to the common mode potential vcm, and a clock-control end of the switch TSx2 (x=1, 2, ..., N) is used for receiving the clock control signal phi1$d$.

For example, the first end of the switch TS11 (i.e. x=1) is coupled to the second end of the twin sampling capacitor TCs1, the second end of the switch TS11 is used for receiving the positive input voltage Vi1$p$ relative to the common mode potential vcm, and the clock-control end of the switch TS11 is used for receiving the clock control signal phi1$d$. Moreover, the first end of the switch TS12 is coupled to the third end of the twin sampling capacitor TCs1, the second end of the switch TS12 is used for receiving the positive input voltage Vi1$p$ relative to the common mode potential vcm, and the clock-control end of the switch TS12 is used for receiving the clock control signal phi1$d$. The others are deduced by analogy, and detailed descriptions thereof are not repeated.

Correspondingly, a first end of the switch S3 is used for receiving the common mode potential vcm, and a clock-control end of the switch S3 is used for receiving the clock control signal phi1. A first end of the switch S4 is coupled to the positive input terminal IP of the fully differential amplifier A, a second end of the switch S4 is coupled to a second end of the switch S3, and a clock-control end of the switch S4 is used for receiving the clock control signal phi2. A first end of the twin sampling capacitor TCsx' (x=1, 2, ..., N) is coupled to the second end of the switch S4, and a second end and a third end of the twin sampling capacitor TCsx' (x=1, 2, ..., N) receive a negative input voltage Vixn (x=1, 2, ..., N) relative to the common mode potential vcm in response to the clock control signal phi1$d$. For example, the second end and the third end of the twin sampling capacitor TCs1' (i.e. x=1) receive the negative input voltage Vi1$n$ relative to the common mode potential vcm in response to the clock control signal phi1$d$. The others are deduced by analogy, and detailed descriptions thereof are not repeated.

In detail, the second end and the third end of the twin sampling capacitor TCsx' (x=1, 2, ..., N) receive the negative input voltage Vixn (x=1, 2, ..., N) relative to the common mode potential vcm respectively through switches TSx1' (x=1, 2, ..., N) and TSx2' (x=1, 2, ..., N). Wherein, a first end of the switch TSx1' (x=1, 2, ..., N) is coupled to the second end of the twin sampling capacitor TCsx' (x=1, 2, ..., N), a second end of the switch TSx 1' (x=1, 2, ..., N) is used for receiving the negative input voltage Vixn (x=1, 2, ..., N) relative to the common mode potential vcm, and a clock-control end of the switch TSx1' (x=1, 2, ..., N) is used for receiving the clock control signal phi1d. Moreover, a first end of the switch TSx2' (x=1, 2, ..., N) is coupled to the third end of the twin sampling capacitor TCsx' (x=1, 2, ..., N), a second end of the switch TSx2' (x=1, 2, ..., N) is used for receiving the negative input voltage Vixn (x=1, 2, ..., N) relative to the common mode potential vcm, and a clock-control end of the switch TSx2' (x=1, 2, ..., N) is used for receiving the clock control signal phi1d.

For example, the first end of the switch TS11' (i.e. x=1) is coupled to the second end of the twin sampling capacitor TCs1', the second end of the switch TS11' is used for receiving the negative input voltage Vi1n relative to the common mode potential vcm, and the clock-control end of the switch TS11' is used for receiving the clock control signal phi1d. Moreover, the first end of the switch TS12' is coupled to the third end of the twin sampling capacitor TCs1', the second end of the switch TS12' is used for receiving the negative input voltage Vi1n relative to the common mode potential vcm, and the clock-control end of the switch TS12' is used for receiving the clock control signal phi1d. The others are deduced by analogy, and detailed descriptions thereof are not repeated.

Figure 2:
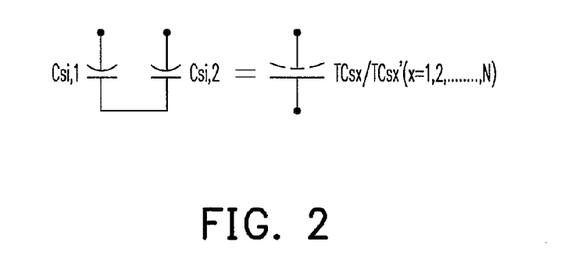
FIG. 2 is a schematic diagram illustrating a twin sampling capacitor according to an exemplary embodiment of the disclosure.

It should be noticed that FIG. 2 is a schematic diagram illustrating a twin sampling capacitor TCsx/TCsx' (x=1, 2, ..., N) according to an exemplary embodiment of the disclosure. Referring to FIG. 2, in the present exemplary embodiment, each of the twin sampling capacitors TCsx/TCsx' (x=1, 2, ..., N) has two capacitors Csi,1 and Csi,2. Wherein, first ends (i.e. top plates of the capacitors Csi,1 and Csi,2) of the capacitors Csi,1 and Csi,2 are mutually coupled to be served as the first end (i.e. a top plate of the twin sampling capacitor TCsx/TCsx') of the twin sampling capacitor TCsx/TCsx' (x=1, 2, ..., N), and second ends of the capacitors Csi,1 and Csi,2 (i.e. bottom plates of the capacitors Csi,1 and Csi,2) are respectively to be served as the second end and the third end (i.e. a bottom plate of the twin sampling capacitor TCsx/TCsx') of the twin sampling capacitor TCsx/TCsx' (x=1, 2, ..., N).

Moreover, the switching unit 103_x (x=1, 2, ..., N) is coupled to the second ends and the third ends of the twin sampling capacitors TCsx (x=1, 2, ..., N) and TCsx' (x=1, 2, ..., N) and the positive output terminal OP and the negative output terminal ON of the fully differential amplifier A, and is used for determining coupling relations respectively between the second ends and the third ends of the twin sampling capacitors TCsx (x=1, 2, ..., N) and TCsx' (x=1, 2, ..., N) and the positive output terminal OP and the negative output terminal ON of the fully differential amplifier A in response to the clock control signal phi2d.

In the present exemplary embodiment, each of the switching units 103_x (x=1, 2, ..., N) includes four switches Ex1-Ex4 (x=1, 2, ..., N). Wherein, a first end of the switch Ex1 (x=1, 2, ..., N) is coupled to the second end of the twin sampling capacitor TCsx (x=1, 2, ..., N), a second end of the switch Ex1 (x=1, 2, ..., N) is coupled to the positive output terminal OP of the fully differential amplifier A, and a clock-control end of the switch Ex1 (x=1, 2, ..., N) is used for receiving the clock control signal phi2d. A first end of the switch Ex2 (x=1, 2, ..., N) is coupled to the positive output terminal OP of the fully differential amplifier A, a second end of the switch Ex2 (x=1, 2, ..., N) is coupled to the third end of the twin sampling capacitor TCsx' (x=1, 2, ..., N), and a clock-control end of the switch Ex2 (x=1, 2, ..., N) is used for receiving the clock control signal phi2d.

A first end of the switch Ex3 (x=1, 2, ..., N) is coupled to the third end of the twin sampling capacitor TCsx (x=1, 2, ..., N), a second end of the switch Ex3 (x=1, 2, ..., N) is coupled to the negative output terminal ON of the fully differential amplifier A, and a clock-control end of the switch Ex3 (x=1, 2, ..., N) is used for receiving the clock control signal phi2d. A first end of the switch Ex4 (x=1, 2, ..., N) is coupled to the negative output terminal ON of the fully differential amplifier A, a second end of the switch Ex4 (x=1, 2, ..., N) is coupled to the second end of the twin sampling capacitor TCsx' (x=1, 2, ..., N), and a clock-control end of the switch Ex4 (x=1, 2, ..., N) is used for receiving the clock control signal phi2d.

For example, the first end of the switch E11 (i.e. x=1) is coupled to the second end of the twin sampling capacitor TCs1, the second end of the switch E11 is coupled to the positive output terminal OP of the fully differential amplifier A, and the clock-control end of the switch E11 is used for receiving the clock control signal phi2d. The first end of the switch E12 is coupled to the positive output terminal OP of the fully differential amplifier A, the second end of the switch E12 is coupled to the third end of the twin sampling capacitor TCs1', and the clock-control end of the switch E12 is used for receiving the clock control signal phi2d. The first end of the switch E13 is coupled to the third end of the twin sampling capacitor TCs1, the second end of the switch E13 is coupled to the negative output terminal ON of the fully differential amplifier A, and the clock-control end of the switch E13 is used for receiving the clock control signal phi2d. The first end of the switch E14 is coupled to the negative output terminal ON of the fully differential amplifier A, the second end of the switch E14 is coupled to the second end of the twin sampling capacitor TCs1', and the clock-control end of the switch E14 is used for receiving the clock control signal phi2d. The others are deduced by analogy, and detailed descriptions thereof are not repeated.

The output switching unit 105 is coupled to the positive output terminal OP and the negative output terminal ON of the fully differential amplifier A, and is used for outputting differential output signals VOP and VON to a next stage switched-capacitor circuit 101 (for example, a switched-capacitor filter, a switched-capacitor analog to digital converter, a switched-capacitor sampling control circuit, etc., though the disclosure is not limited thereto) in response to the clock control signal phi1d.

In the present exemplary embodiment, the output switching unit 105 includes switches OS1 and OS. Wherein, a first end of the switch OS1 is coupled to the positive output terminal OP of the fully differential amplifier A, and a clock-control end of the switch OS1 is used for receiving the clock control signal phi1d. Moreover, a first end of the switch OS2 is coupled to the negative output terminal ON of the fully differential amplifier A, and a clock-control end of the switch OS2 is used for receiving the clock control signal phi1d. In this way, the switches OS1 and OS2 can output the differential output signals VOP and VON to the next stage switched-capacitor circuit 101 through the second ends thereof in response to the clock control signal phi1d.

The above mentioned clock control signals phi1, phi2, phi1d, phi2d, phi2A, phi2Ad, phi2B and phi2Bd are generated by the clock control unit 107, which are used for controlling operations (i.e. turning on or turning off operation) of the switches S1-S20, TSx1 (x=1, 2, ..., N), TSx2 (x=1, 2, ..., N), Ex1-Ex4 (x=1, 2, ..., N), OS1 and OS2.

Figure 3:
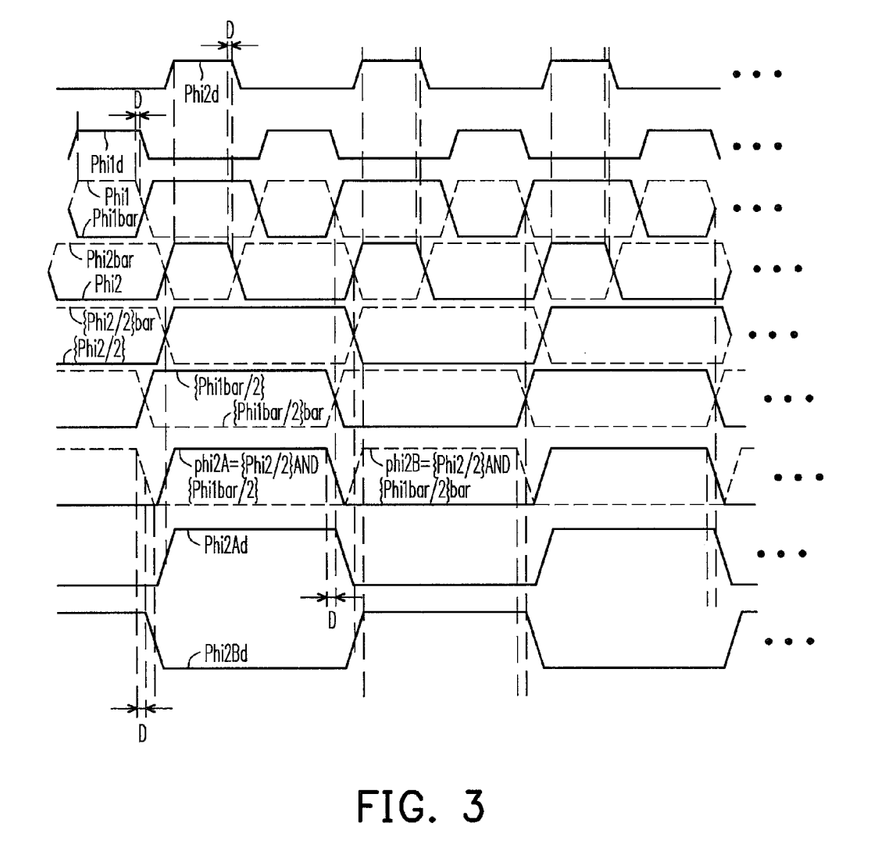
FIG. 3 is a schematic diagram illustrating clock control signals generated by a clock control unit according to an exemplary embodiment of the disclosure.

In detail, FIG. 3 is a schematic diagram illustrating clock control signals phi1, phi2, phi1d, phi2d, phi2A, phi2Ad, phi2B and phi2Bd generated by the clock control unit according to an exemplary embodiment of the disclosure. Referring to FIG. 3, in the present exemplary embodiment, the clock control signals phi1 and phi2 are mutually inverted and non-overlapped. Moreover, rising edges of the clock control signals phi1 and phi1d are substantially aligned, though falling edges of the clock control signals phi1 and phi1d substantially have a delay D (wherein a length of the delay D can be determined according to an actual design requirement). Similarly, rising edges of the clock control signals phi2 and phi2d are substantially aligned, though falling edges of the clock control signals phi2 and phi2d substantially have the delay D (wherein the length of the delay D can be determined according to an actual design requirement).

Moreover, the clock control unit 107 can generate the clock control signal phi2A according to an AND operation result of the clock control signal phi2 being frequency-divided (for example, divided by 2) (i.e. phi2/2) and the clock control signal phi1 being first inverted and then frequency-divided (for example, divided by 2) (i.e. {philbar/2}). On the other hand, the clock control unit 107 can generate the clock control signal phi2B according to an AND operation result of the clock control signal phi2 being first frequency-divided (for example, divided by 2) and then inverted (i.e. {phi2/2}bar) and the clock control signal phi1 being first inverted and frequency-divided (for example, divided by 2) and then again inverted (i.e. {philbar/2}bar).

In the present exemplary embodiment, rising edges of the clock control signals phi2A and phi2Ad are substantially aligned, though falling edges of the clock control signals phi2A and phi2Ad substantially have a delay D (wherein a length of the delay D can be determined according to an actual design requirement). Similarly, rising edges of the clock control signals phi2B and phi2Bd are substantially aligned, though falling edges of the clock control signals phi2B and phi2Bd substantially have the delay D (wherein the length of the delay D can be determined according to an actual design requirement).

According to the above descriptions, during a sampling phase of the switched-capacitor summing circuit 100, the clock control signals phi1, phi1d, phi2B and phi2Bd are enabled, so that the adjustable feedback capacitors CsumA and CsumA' are reset, and the second end and the third end of each of the twin sampling capacitors TCsx (x=1, 2, ..., N) may receive the corresponding positive input voltage Vixp (x=1, 2, ..., N), and the second end and the third end of each of the twin sampling capacitors TCsx' (x=1, 2, ..., N) may receive the corresponding negative input voltage Vixn (x=1, 2, ..., N).

In this way, the bottom plate of each of the twin sampling capacitors TCsx (x=1, 2, ..., N) is accumulated with positive charges relative to the positive input voltage Vixp (x=1, 2, ..., N), and the top plate of each of the twin sampling capacitors TCsx (x=1, 2, ..., N) is accumulated with negative charges relative to the positive charges of the bottom plate thereof. Similarly, the bottom plate of each of the twin sampling capacitors TCsx' (x=1, 2, ..., N) is accumulated with negative charges relative to the negative input voltage Vixn (x=1, 2, ..., N), and the top plate of each of the twin sampling capacitors TCsx' (x=1, 2, ..., N) is accumulated with positive charges relative to the negative charges of the bottom plate thereof.

Then, during a summing phase of the switched-capacitor summing circuit 100, the clock control signals phi2, phi2d, phi2A and phi2Ad are enabled, so that the fourth switches Ex1-Ex4 (x=1, 2, ..., N) in each of the switching units 103_x (x=1, 2, ..., N) are all turned on. In this way, the positive charges of the second end of every of the twin sampling capacitors TCsx (x=1, 2, ..., N) are blended with the negative charges of the third end of corresponding twin sampling capacitors TCsx' (x=1, 2, ..., N), and the positive charges of the third end of every of the twin sampling capacitors TCsx (x=1, 2, ..., N) are blended with the negative charges of the second end of corresponding twin sampling capacitors TCsx' (x=1, 2, ..., N). It should be noticed that the adjustable feedback capacitors CsumB and CsumB' are now being reset.

Accordingly, the negative charges accumulated on the top plate of every of the twin sampling capacitors TCsx (x=1, 2, ..., N) are summed (i.e. implementation of the summing algorithm) by the adjustable feedback capacitor CsumA based on a negative feedback loop of the fully differential amplifier A. Relatively, the positive charges accumulated on the top plate of every of the twin sampling capacitors TCsx' (x=1, 2, ..., N) are summed (i.e. implementation of the summing algorithm) by the adjustable feedback capacitor CsumA' based on a negative feedback loop of the fully differential amplifier A. Theoretically, in the switched-capacitor summing circuit 100, a feedback factor (i.e. β) of the negative feedback of the fully differential amplifier A is not reduced as input paths are increased, and the feedback factor β is ideally close to 1. Therefore, the switched-capacitor summing circuit 100 may benefit from a better closed-loop bandwidth performance.

The adjustable feedback capacitors CsumA/CsumA' and CsumB/CsumB' are alternatively reset every two phases of the sampling phase and the summing phase of the switched-capacitor summing circuit 100, so that the charges associated with the former positive and negative input voltages Vixp and Vixn are less liable to being remained in the adjustable feedback capacitors CsumA/CsumA' and CsumB/CsumB', and therefore the switched-capacitor summing circuit 100 can more accurately provide the differential output signals VOP and VON associated with the summing algorithm of the current positive and negative input voltages Vixp (x=1, 2, ..., N) and Vixn (x=1, 2, ..., N) to the next stage switched-capacitor circuit 101.

Moreover, a gain of the input paths of the switched-capacitor summing circuit 100 can be determined by designing/setting a capacitance ratio between the single twin sampling capacitor and the adjustable feedback capacitor thereof, i.e. TCsx/CsumA (x=1, 2, ..., N), TCsx/CsumB (x=1, 2, ..., N), TCsx'/CsumA' (x=1, 2, ..., N), and TCsx'/CsumB' (x=1, 2, ..., N). In this way, the gain of the input paths of the switched-capacitor summing circuit 100 is easily up/down-scaleable, so that the switched-capacitor summing circuit 100 can provide more flexible gain design.

It should be noticed that if the mechanism for resetting the charges of the adjustable feedback capacitors CsumA, CsumA', CsumB and CsumB' in the switched-capacitor summing circuit 100 is disabled or removed, the switched-capacitor summing circuit 100 can serve as a switched-capacitor integration circuit.

Figure 4:
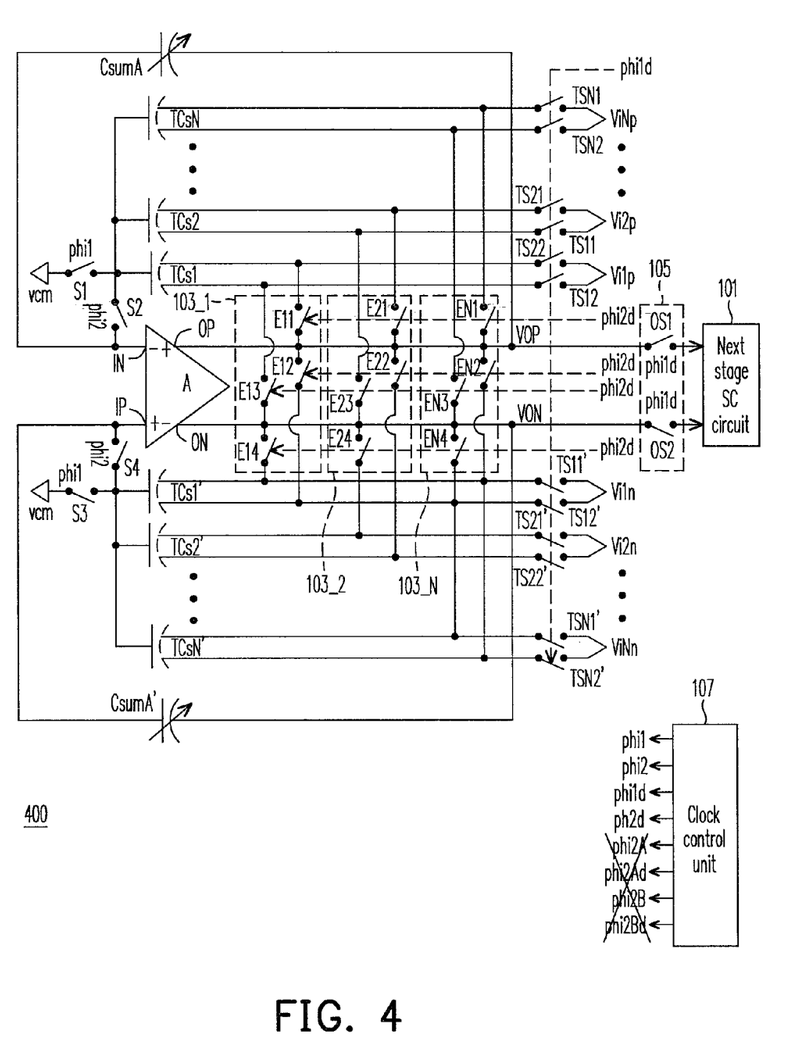
FIG. 4 is a schematic diagram illustrating a switched-capacitor integration circuit according to an exemplary embodiment of the disclosure.

In detail, FIG. 4 is a schematic diagram illustrating a switched-capacitor integration circuit 400 according to an exemplary embodiment of the disclosure. Referring to FIG. 1 and FIG. 4, compared to the switched-capacitor summing circuit 100 of FIG. 1, in the switched-capacitor integration circuit 400 of FIG. 4, all of the switches S5-S20 controlled by the control signals phi2A, phi2Ad, phi2B and phi2Bd are omitted. In this way, the charges stored in the adjustable feedback capacitors CsumA and CsumA' can be accumulated during an integration phase of the switched-capacitor integration circuit 400, so as to implement the integration algorithm.

Accordingly, the switched-capacitor integration circuit 400 can accurately provide the differential output signals VOP and VON associated with the integration algorithm of multiple sets of positive and negative input voltages Vixp (x=1, 2, . . . , N) and Vixn (x=1, 2, . . . , N) to the next stage switched-capacitor circuit 101.

In summary, since the switched-capacitor summing circuit of the disclosure uses an alternate resetting method to reset the adjustable feedback capacitors, the charges associated with the former positive and negative input voltages are less liable to being remained in the adjustable feedback capacitors, so that the switched-capacitor summing circuit of the disclosure can more accurately provide the differential output signals associated with the summing algorithm of the current positive and negative input voltages to the next stage switched-capacitor circuit. Herein, if the mechanism for resetting the charges of the adjustable feedback capacitors in the switched-capacitor summing circuit is disabled or removed, the switched-capacitor summing circuit of the disclosure can serve as a switched-capacitor integration circuit.

Moreover, the gain of every of the input paths of the switched-capacitor summing circuit of the disclosure can be determined by designing/setting a capacitance ratio between the single twin sampling capacitor and the adjustable feedback capacitor thereof. In this way, the gain of every of the input paths of the switched-capacitor summing circuit is easily up/down-scaleable, so that the switched-capacitor summing circuit of the disclosure can provide more flexible gain design.

In addition, since the switched-capacitor summing circuit of the disclosure combines a circuit manner of the positive and negative feedback loops of the fully differential amplifier, the charges gathered on the top plate of each of the twin sampling capacitor can be accumulated to the adjustable feedback capacitor. In this way, in the switched-capacitor summing circuit, the feedback factor (i.e. β) of the negative feedback of the fully differential amplifier A is not reduced as input paths are increased, and the feedback factor β is ideally close to 1.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A switched-capacitor circuit, comprising:
a fully differential amplifier, having a positive input terminal, a negative input terminal, a positive output terminal and a negative output terminal;
a first adjustable feedback capacitor, having a first end coupled to the negative input terminal, and a second end coupled to the positive output terminal;
a first switch, having a first end receiving a common mode potential, and a clock-control end receiving a first clock control signal;
a second switch, having a first end coupled to the negative input terminal, a second end coupled to a second end of the first switch, and a clock-control end receiving a second clock control signal;
a first twin sampling capacitor, having a first end coupled to the second end of the second switch, and a second end and a third end receiving a first positive input voltage relative to the common mode potential in response to a third clock control signal;
a second adjustable feedback capacitor, having a first end coupled to the positive input terminal, and a second end coupled to the negative output terminal;
a third switch, having a first end receiving the common mode potential, and a clock-control end receiving the first clock control signal;
a fourth switch, having a first end coupled to the positive input terminal, a second end coupled to a second end of the third switch, and a clock-control end receiving the second clock control signal;
a second twin sampling capacitor, having a first end coupled to the second end of the fourth switch, and a second end and a third end receiving a first negative input voltage relative to the common mode potential in response to the third clock control signal;
a first switching unit, coupled to the second ends and the third ends of the first and the second twin sampling capacitors, the positive output terminal and the negative output terminal, for determining coupling relations respectively between the second ends and the third ends of the first and the second twin sampling capacitors and the positive output terminal and the negative output terminal in response to a fourth clock control signal; and
an output switching unit, coupled to the positive output terminal and the negative output terminal, for outputting a differential output signal in response to the third clock control signal.

2. The switched-capacitor circuit as claimed in claim 1, wherein the first switching unit comprises:
a fifth switch, having a first end coupled to the second end of the first twin sampling capacitor, a second end coupled to the positive output terminal, and a clock-control end receiving the fourth clock control signal;
a sixth switch, having a first end coupled to the positive output terminal, a second end coupled to the third end of the second twin sampling capacitor, and a clock-control end receiving the fourth clock control signal;
a seventh switch, having a first end coupled to the third end of the first twin sampling capacitor, a second end coupled to the negative output terminal, and a clock-control end receiving the fourth clock control signal; and
an eighth switch, having a first end coupled to the negative output terminal, a second end coupled to the second end of the second twin sampling capacitor, and a clock-control end receiving the fourth clock control signal.

3. The switched-capacitor circuit as claimed in claim 2, wherein the output switching unit comprises:
a ninth switch, having a first end coupled to the positive output terminal, and a clock-control end receiving the third clock control signal; and
a tenth switch, having a first end coupled to the negative output terminal, and a clock-control end receiving the third clock control signal,
wherein second ends of the ninth switch and the tenth switch are used for outputting the differential output signal.

4. The switched-capacitor circuit as claimed in claim 3, further comprising:
an eleventh switch, having a first end coupled to the second end of the first twin sampling capacitor, a second end receiving the first positive input voltage, and a clock-control end receiving the third clock control signal;
a twelfth switch, having a first end coupled to the third end of the first twin sampling capacitor, a second end receiving the first positive input voltage, and a clock-control end receiving the third clock control signal;

a thirteenth switch, having a first end coupled to the second end of the second twin sampling capacitor, a second end receiving the first negative input voltage, and a clock-control end receiving the third clock control signal; and a fourteenth switch, having a first end coupled to the third end of the second twin sampling capacitor, a second end receiving the first negative input voltage, and a clock-control end receiving the third clock control signal.

5. The switched-capacitor circuit as claimed in claim 4, further comprising:

a third twin sampling capacitor, having a first end coupled to the second end of the second switch, and a second end and a third end receiving a second positive input voltage relative to the common mode potential in response to the third clock control signal;

a fourth twin sampling capacitor, having a first end coupled to the second end of the fourth switch, and a second end and a third end receiving a second negative input voltage relative to the common mode potential in response to the third clock control signal; and a second switching unit, coupled to the second ends and the third ends of the third and the fourth twin sampling capacitors, the positive output terminal and the negative output terminal, for determining coupling relations respectively between the second ends and the third ends of the third and the fourth twin sampling capacitors and the positive output terminal and the negative output terminal in response to the fourth clock control signal.

6. The switched-capacitor circuit as claimed in claim 5, wherein the second switching unit comprises:

a fifteenth switch, having a first end coupled to the second end of the third twin sampling capacitor, a second end coupled to the positive output terminal, and a clock-control end receiving the fourth clock control signal;

a sixteenth switch, having a first end coupled to the positive output terminal, a second end coupled to the third end of the fourth twin sampling capacitor, and a clock-control end receiving the fourth clock control signal;

a seventeenth switch, having a first end coupled to the third end of the third twin sampling capacitor, a second end coupled to the negative output terminal, and a clock-control end receiving the fourth clock control signal; and an eighteenth switch, having a first end coupled to the negative output terminal, a second end coupled to the second end of the fourth twin sampling capacitor, and a clock-control end receiving the fourth clock control signal.

7. The switched-capacitor circuit as claimed in claim 6, further comprising:

a nineteenth switch, having a first end coupled to the second end of the third twin sampling capacitor, a second end receiving the second positive input voltage, and a clock-control end receiving the third clock control signal;

a twentieth switch, having a first end coupled to the third end of the third twin sampling capacitor, a second end receiving the second positive input voltage, and a clock-control end receiving the third clock control signal;

a twenty-first switch, having a first end coupled to the second end of the fourth twin sampling capacitor, a second end receiving the second negative input voltage, and a clock-control end receiving the third clock control signal; and a twenty-second switch, having a first end coupled to the third end of the fourth twin sampling capacitor, a second end receiving the second negative input voltage, and a clock-control end receiving the third clock control signal.

8. The switched-capacitor circuit as claimed in claim 7, wherein the first twin sampling capacitor comprises a first capacitor and a second capacitor, and first ends of the first and the second capacitors are coupled to each other to be served as the first end of the first twin sampling capacitor, and second ends of the first and the second capacitors are respectively to be served as the second end and the third end of the first twin sampling capacitor;

the second twin sampling capacitor comprises a third capacitor and a fourth capacitor, and first ends of the third and the fourth capacitors are coupled to each other to be served as the first end of the second twin sampling capacitor, and second ends of the third and the fourth capacitors are respectively to be served as the second end and the third end of the second twin sampling capacitor;

the third twin sampling capacitor comprises a fifth capacitor and a sixth capacitor, and first ends of the fifth and the sixth capacitors are coupled to each other to be served as the first end of the third twin sampling capacitor, and second ends of the fifth and the sixth capacitors are respectively to be served as the second end and the third end of the third twin sampling capacitor; and the fourth twin sampling capacitor comprises a seventh capacitor and an eighth capacitor, and first ends of the seventh and the eighth capacitors are coupled to each other to be served as the first end of the fourth twin sampling capacitor, and second ends of the seventh and the eighth capacitors are respectively to be served as the second end and the third end of the fourth twin sampling capacitor.

9. The switched-capacitor circuit as claimed in claim 8, wherein the switched-capacitor circuit is a switched-capacitor integration circuit.

10. The switched-capacitor circuit as claimed in claim 8, further comprising:

a clock control unit, coupled to the clock-control ends of the first to the twenty-second switches, for generating the first to the fourth clock control signals, wherein the first and the second clock control signal are mutually inverted and non-overlapped; rising edges of the first and the third clock control signals are substantially aligned, though falling edges of the first and the third clock control signals substantially have a delay; and rising edges of the second and the fourth clock control signals are substantially aligned, though falling edges of the second and the fourth clock control signals substantially have a delay.

11. The switched-capacitor circuit as claimed in claim 10, further comprising:

a twenty-third switch, having a first end coupled to the negative input terminal, a second end coupled to the first end of the first adjustable feedback capacitor, and a clock-control end receiving a fifth clock control signal; and a twenty-fourth switch, having a first end coupled to the second end of the first adjustable feedback capacitor, a second end coupled to the positive output terminal, and a clock-control end receiving a sixth clock control signal.

12. The switched-capacitor circuit as claimed in claim 11, further comprising:

a twenty-fifth switch, having a first end coupled to the negative input terminal, and a clock-control end receiving a seventh clock control signal;

a third adjustable feedback capacitor, having a first end coupled to a second end of the twenty-fifth switch;

a twenty-sixth switch, having a first end coupled to a second end of the third adjustable feedback capacitor, a second end coupled to the positive output terminal, and a clock-control end receiving an eighth clock control signal;

a twenty-seventh switch, having a first end coupled to the second end of the twenty-fifth switch, a second end receiving the common mode potential, and a clock-control end receiving the fifth clock control signal;

a twenty-eighth switch, having a first end coupled to the first end of the first adjustable feedback capacitor, a second end receiving the common mode potential, and a clock-control end receiving the seventh clock control signal;

a twenty-ninth switch, having a first end coupled to the second end of the third adjustable feedback capacitor, a second end receiving the common mode potential, and a clock-control end receiving the fifth clock control signal; and a thirtieth switch, having a first end coupled to the second end of the first adjustable feedback capacitor, a second end receiving the common mode potential, and a clock-control end receiving the seventh clock control signal.

13. The switched-capacitor circuit as claimed in claim 12, further comprising:

a thirty-first switch, having a first end coupled to the positive input terminal, a second end coupled to the first end of the second adjustable feedback capacitor, and a clock-control end receiving the fifth clock control signal; and a thirty-second switch, having a first end coupled to the second end of the second adjustable feedback capacitor, a second end coupled to the negative output terminal, and a clock-control end receiving the sixth clock control signal.

14. The switched-capacitor circuit as claimed in claim 13, further comprising:

a thirty-third switch, having a first end coupled to the positive input terminal, and a clock-control end receiving the seventh clock control signal;

a fourth adjustable feedback capacitor, having a first end coupled to a second end of the thirty-third switch;

a thirty-fourth switch, having a first end coupled to a second end of the fourth adjustable feedback capacitor, a second end coupled to the negative output terminal, and a clock-control end receiving the eighth clock control signal;

a thirty-fifth switch, having a first end coupled to the second end of the thirty-third switch, a second end receiving the common mode potential, and a clock-control end receiving the fifth clock control signal;

a thirty-sixth switch, having a first end coupled to the first end of the third adjustable feedback capacitor, a second end receiving the common mode potential, and a clock-control end receiving the seventh clock control signal;

a thirty-seventh switch, having a first end coupled to the second end of the fourth adjustable feedback capacitor, a second end receiving the common mode potential, and a clock-control end receiving the fifth clock control signal; and a thirty-eighth switch, having a first end coupled to the second end of the third adjustable feedback capacitor, a second end receiving the common mode potential, and a clock-control end receiving the seventh clock control signal.

15. The switched-capacitor circuit as claimed in claim 14, wherein the clock control unit is further coupled to the clock-control ends of the twenty-third to the thirty-eighth switches for further generating the fifth to the eighth clock control signals, wherein the clock control unit generates the fifth clock control signal according to an AND operation result of the second clock control signal being frequency-divided and the first clock control signal being first inverted and then frequency-divided; the clock control unit generates the seventh clock control signal according to an AND operation result of the second clock control signal being first frequency-divided and then inverted and the first clock control signal being first inverted and frequency-divided and then again inverted; rising edges of the fifth and the sixth clock control signals are substantially aligned, though falling edges of the fifth and the sixth clock control signals substantially have a delay; and rising edges of the seventh and the eighth clock control signals are substantially aligned, though falling edges of the seventh and the eighth clock control signals substantially have a delay.

16. The switched-capacitor circuit as claimed in claim 14, wherein the switched-capacitor circuit is a switched-capacitor summing circuit.

* * * * *